United States Patent [19]

Miura et al.

[11] Patent Number: 5,047,751
[45] Date of Patent: Sep. 10, 1991

[54] POWER SUPPLY VOLTAGE MONITORING CIRCUIT

[75] Inventors: Tadahiko Miura; Takahashi, both of Tokyo, Japan

[73] Assignee: NEC Corporation, Tokyo, Japan

[21] Appl. No.: 473,280

[22] Filed: Jan. 31, 1990

[30] Foreign Application Priority Data

Feb. 3, 1989 [JP] Japan .................................. 1-24861

[51] Int. Cl.$^5$ .............................................. G08B 21/00
[52] U.S. Cl. .................................. 340/661; 328/146; 307/364
[58] Field of Search ............... 340/661, 660; 307/363, 307/364; 328/146, 147, 148

[56] References Cited

U.S. PATENT DOCUMENTS 4,613,770  9/1986  Raab ............................. 328/146 X
4,916,570  4/1990  Dale .............................. 340/661 X

OTHER PUBLICATIONS

"Three Voltage-Band Detectors" by J. L. VanFeldt, IBM technical disclosure bulletin, Jul. 1964.

Primary Examiner—Donnie L. Crosland
Assistant Examiner—Jeffery A. Hofsass
Attorney, Agent, or Firm—Helfgott & Karas

[57] ABSTRACT

A power supply voltage monitoring circuit for use in a semiconductor circuit which is used with a plurality of power supply systems and is operable by switching the high and low power supply voltages, includes at least two power supply lines, a reference voltage source, a first comparator, a second comparator and a switching transistor disposed between the first comparator and second comparator. The first comparator operates under a threshold value of a supply voltage which is an intermediate voltage between the high and low power supply voltages. The second comparator receives a voltage to be compared with a reference voltage supplied from the reference voltage source and the switching transistor changes, in response to an output from the first comparator, a voltage to be compared by the second comparator. An alarm signal indicating as to whether the supply voltage is normal or abnormal is obtained at an output of the second comparator.

8 Claims, 4 Drawing Sheets

F I G. 1
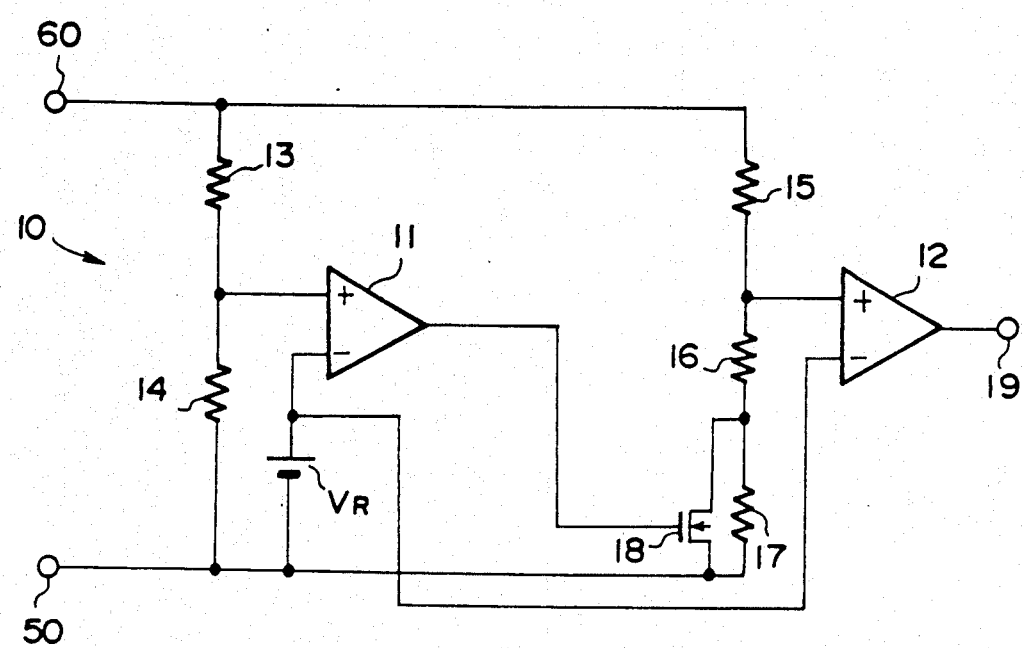
F I G. 2
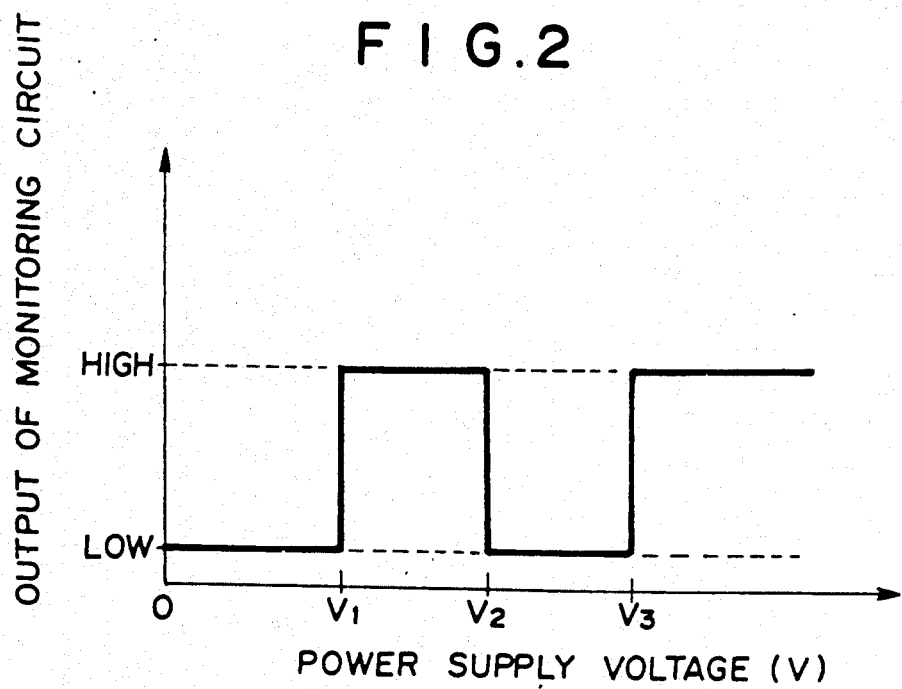

POWER SUPPLY VOLTAGE MONITORING CIRCUIT

BACKGROUND OF THE INVENTION

The present invention relates to a power supply voltage monitoring circuit and, more particularly, to a power supply voltage monitoring circuit suited to be incorporated in a semiconductor integrated circuit device which is operable by having the potentials of power supply voltages switched in two steps.

Generally, a power supply voltage monitoring circuit is a circuit for producing an alarm or the like or stopping the operation of a related circuit when the supply voltage becomes lower (or higher) than a predetermined value thereof.

Standard power supply voltages used in various electronic devices now available are, for example, 5 V, 9 V, 12 V, 24 V, ±15 V, −5.2 V and, for purposes of making a wider range of use, it is desirable for such semiconductor devices to be so designed from the outset that they can be commonly used with two or more power supply systems whose supply voltages are different from one another. In order to incorporate such a supply voltage monitoring circuit in a semiconductor integrated circuit device which is capable of being used with a plurality of power supply systems, conventionally it was necessary to use either one of the following two methods:

i) The setting of the monitoring voltage in the power supply voltage monitoring circuit be effected externally of the semiconductor device and such setting be specific to the particular electronic device to be used; or ii) A plurality of the power supply voltage monitoring circuits be incorporated in the device and one of them to be used be selected from external means.

However, in either of the above two cases, a particular terminal is necessary either for the external setting or for the selective use of the monitoring circuits. As such a terminal cannot be used for other purposes, there is a disadvantage that other functions are prevented from being incorporated without an increase in the number of terminals.

SUMMARY OF THE INVENTION

It is an object of the present invention to provide an improved power supply voltage monitoring circuit suitable to be incorporated in the semiconductor integrated circuit device.

It is another object of the present invention to provide a power supply voltage monitoring circuit by which a plurality of power supply voltages can be detected as to whether they are being maintained within the values of a predetermined range. This can be achieved without increasing the number of terminals of the integrated circuit device.

According to one aspect of the invention, there is provided a power supply voltage monitoring circuit for use in a semiconductor circuit which is operable by having the high and low power supply voltages changed, the monitoring circuit comprising:
 a potential power supply line;
 a reference voltage source connected at its one side to the low potential power supply line;
 a first comparing means having a threshold value at a supply voltage being an intermediate voltage between the high and low power supply voltages;
 a second comparing means having a comparator receiving the voltage to be compared against a reference voltage supplied from the reference voltage source; and
 a switching means for changing in response to an output from the first comparing means the voltage to be compared by the second comparing means,
 whereby an alarm signal indicating as to whether the supply voltage is normal or abnormal is obtained at an output of the second comparing means.

According to another aspect of the invention, there is provided a power supply voltage monitoring circuit for use in a semiconductor circuit which is operable in two supply voltage systems of high and low power supply voltages, the monitoring circuit comprising:
 a high and a low potential power supply line;
 three comparing means having threshold values at the supply voltages being respectively $V_1$, $V_2$ and $V_3$ ($V_1 < V_2 < V_3$);
 a reference voltage source connected at its one side to the low potential power supply line and at the other side commonly to the three comparing means; and
 a logical circuit means receiving the respective outputs from the three comparing means and producing a first level output when the supply voltage is below $V_1$ or between $V_2$ and $V_3$ and a second level when the same is between $V_1$ and $V_2$ or over $V_3$,
 whereby whether the supply voltage is normal or abnormal is determined.

BRIEF DESCRIPTION OF THE DRAWINGS

The above and other objects, features and advantages of the present invention will be apparent from the following description of some preferred embodiments of the invention with reference to the accompanying drawings, in which:

FIG. 1 shows a circuit diagram of a power supply voltage monitoring circuit of a first embodiment according to the present invention;

FIG. 2 shows in a graph form a performance of the circuit contemplated by the present invention;

PREFERRED EMBODIMENTS OF THE INVENTION

Figure 3:
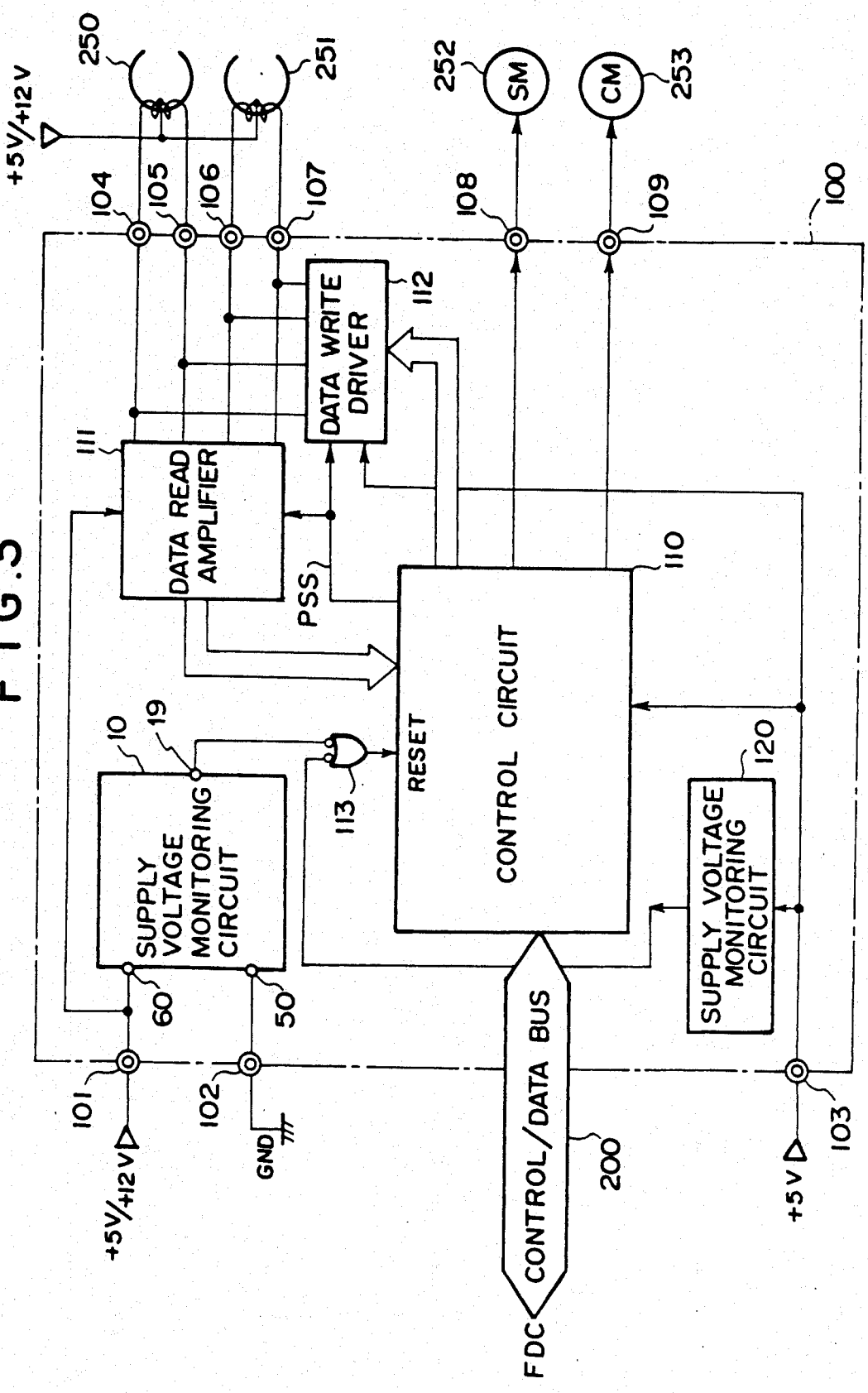
FIG. 3 shows a block diagram of the integrated circuit device in which the power supply voltage monitoring circuit shown in FIG. 1 is incorporated.

Throughout the following description, similar reference symbols or numerals refer to similar elements in all Figures of the drawings.

Hereinafter the present invention is explained in detail with reference to the appended drawings.

FIG. 1 shows a circuit diagram of a voltage monitoring circuit 10 of the first embodiment according to the present invention. A divider resistor 13 is connected at its one end to a high potential power supply line 60 and at its the other end to a non-inversion input terminal of a comparator 11 and also to one end of a divider resistor 14. The other end of the divider resistor 14 is connected to a low potential power supply line 50. A reference voltage source $V_R$ is connected at its high potential side to inversion input terminals of the comparator 11 and a comparator 12 respectively, and at its low potential side to the low potential power supply line 50. An output terminal of the comparator 11 is connected to a gate electrode of an N-channel MOS transistor 18 acting as a switching means. A divider resistor 15 is connected at its one end to the high potential power supply line 60 and at its other end to a non-inversion input terminal of the comparator 12 and to one end of a divider resistor 16. The other end of the resistor 16 is connected to one end of a divider resistor 17 and to a drain electrode of the MOS transistor 18. The other end of the divider resistor 17 and a source electrode of the MOS transistor 18 are connected to the low potential power supply line 50. An output of the comparator 12 is connected to an output terminal 19.

Next, the actual operation of the circuit described above will be explained. First, the resistance ratio of the divider resistors 13 and 14 is so set in advance that the output of the comparator 11 is changed at the level $V_2$ (hereinafter referred to as "$V_2$", and other levels as "$V_1$" or "$V_3$") of the power supply voltage, which level is of an intermediate value between the supply voltages of the two different supply systems.

When the supply voltage is higher than $V_3$ of the monitoring voltage for a high power supply system, the voltage applied to the non-inversion input terminal of the comparator 11 is higher than that of the reference voltage source $V_R$, thereby rendering the output of the comparator 11 to be of a high level. Therefore, the MOS transistor 18 becomes conductive and the potential of the joint point between the divider resistors 16 and 17 becomes the same as that of the low potential power supply line 50. Under this condition, the potential of the power supply voltage is monitored by the comparator 12. The resistance ratio of the divider resistors 15 and 16 is so determined in advance that, when the power supply voltage gradually decreases and becomes lower than $V_3$, the output of the comparator 12 is inverted. When the power supply voltage further decreases and becomes lower than $V_2$, the voltage applied to the non-inversion input terminal of the comparator 11 becomes lower than the voltage of the reference voltage source $V_R$, so that the output of the comparator 11 is inverted and the MOS transistor 18 turns off accordingly. As a consequence, the voltage applied to the non-inversion input terminal of the comparator 12 becomes higher than that of the reference voltage source $V_R$ and the output of this comparator 12 is again inverted and becomes high level. The resistance ratio of the divider resistors 15 through 17 is so set that, when the supply voltage still further decreases and becomes the same as $V_1$, the voltage applied to the non-inversion input terminal of the comparator 12 becomes the same as that of the reference voltage source $V_R$. Thus, when the power supply voltage becomes lower than $V_1$, the output of the comparator 12 is inverted a third time and the abnormality of the power supply voltage is thus detected.

The above has explained the fundamental performance of the circuit according to the present invention.

FIG. 2 shows, in a graph form, the circuit performance which is intended by the present invention. The axis of abscissa therein is for the power supply voltage and represents the potential of the high potential power supply line 60 with the potential of the low potential power supply line 50 taken as its reference. The vertical axis thereof represents levels of the output (terminal 19) of the power supply voltage monitoring circuit 10. The output of the power supply voltage monitoring circuit 10 being at its high level means that the supply voltage is normal and, the same being at its low level means that the supply voltage is abnormal or extraordinary. That is, it is judged by the power supply voltage monitoring circuit 10 of the present invention that the supply voltages of $0-V_1$ volts are abnormal, $V_1-V_2$ volts are normal, $V_2-V_3$ volts are abnormal, and over $V_3$ volts are normal.

Now referring to FIG. 3, there is shown a semiconductor integrated circuit device 100 in which is incorporated the FIG. 1 power supply voltage monitoring circuit 10 shown simply in a block form. The integrated circuit device 100 is a read/write control IC for driving floppy disk drives and has head connection terminals 104 through 107 to which magnetic heads 250, 251 are connected, motor driving terminals 108, 109 to which a spindle motor 252 and a stepping motor 253 are respectively connected, and a first, a second and a third power supply terminal 101, 102 and 103. To the first power supply terminal 101 the supply voltage of either 5 V or 12 V is applied and, the same is supplied to a data read amplifier 111. That is, the data read amplifier 111 is designed to be operable under either of the supply voltage 5 V or 12 V. To the coils of the magnetic heads 250 and 251, the power supply voltage of either 5 V or 12 V is supplied. When the voltage supplied to the magnetic head coil is 12 V, the supply voltage of 12 V is also applied to the power supply terminal 101. On the other hand, to the power supply terminal 103 the supply voltage of 5 V is applied and, the same is supplied to a control circuit 110 and a data write driver 112. The second power supply terminal 102 is grounded as a system ground. The control circuit 110 communicates with a floppy disk controller FDC (not shown in detail) through a control/data bus 200 and also controls the respective operations of the data read amplifier 111 and the data write driver 112.

The first and second power supply terminals 101 and 102 are connected to the high potential power supply terminal 60 and the low potential power supply terminal 50, respectively, of the power supply voltage monitoring circuit 10 shown in FIG. 1. The output terminal 19 of the monitoring circuit 10 is connected to one of the non-inversion input terminals of an OR gate 113. To the other non-inversion input terminal of the OR gate 113, there is provided an output from a second power supply voltage monitoring circuit 120. The output of the OR gate 113 is applied to the reset terminal RESET of the control circuit 110.

As the power supply voltage monitoring circuit 10 is for monitoring the supply voltages of 5 V and 12 V, the respective circuit constants, that is, the respective resistance ratios of the divider resistors in FIG. 1 are so set that the respective levels $V_1$, $V_2$ and $V_3$ shown in FIG. 2 are to be, for example, 3 V, 7 V and 10 V, respectively. Accordingly, the output terminal 19 of the monitoring circuit 10 becomes low level at the time when the supply voltage becomes lower than 3 V and when it is within the range between 7 V and 10 V. On the other hand, the second monitoring circuit 120 operates to detect the supply voltage of 5 V only and is so arranged that its output becomes low level when the supply voltage becomes lower than 3 V. As this second monitoring circuit 120 can be composed of a combination of a supply voltage divider circuit, a reference voltage source and a comparator, all well known to those skilled in the art, an explanation and showing in the drawings thereof are omitted here.

The output of the OR gate 113 becomes high level at the time when the voltage supplied to the power supply terminal 101 or 103 becomes lower than 3 V or when the voltage supplied to the power source terminal 101 is within the range between 7 V and 10 V, thereby rendering the control circuit 110 to be in a reset state. The control circuit 110 is initialized under the above reset state and causes a power save signal PSS to be in its active level. The data read amplifier 111 and the data write driver 112 are put in a power down mode when the power save signal PSS is in its active level, thereby reducing power consumption during the reset state. With the recovery of the power supply voltage, the output of the OR gate 113 reverts to its low level and the reset state of the control circuit 110 is released.

Since the data read amplifier 111 can operate under the power supply voltage of not only 12 V but also 5 V, it operates under any voltage between 7 V and 10 V which is reduced from the power supply voltage of 12 V. However, as any voltage between 7 V and 10 V is insufficient for the magnetic heads 250 and 251 which are designed to operate under the supply voltage of 12 V, the normal read/write operations of the heads cannot be effected. Thus, the reset control as described above is conducted in the read/write control integrated circuit device for floppy disk drives.

Figure 4:
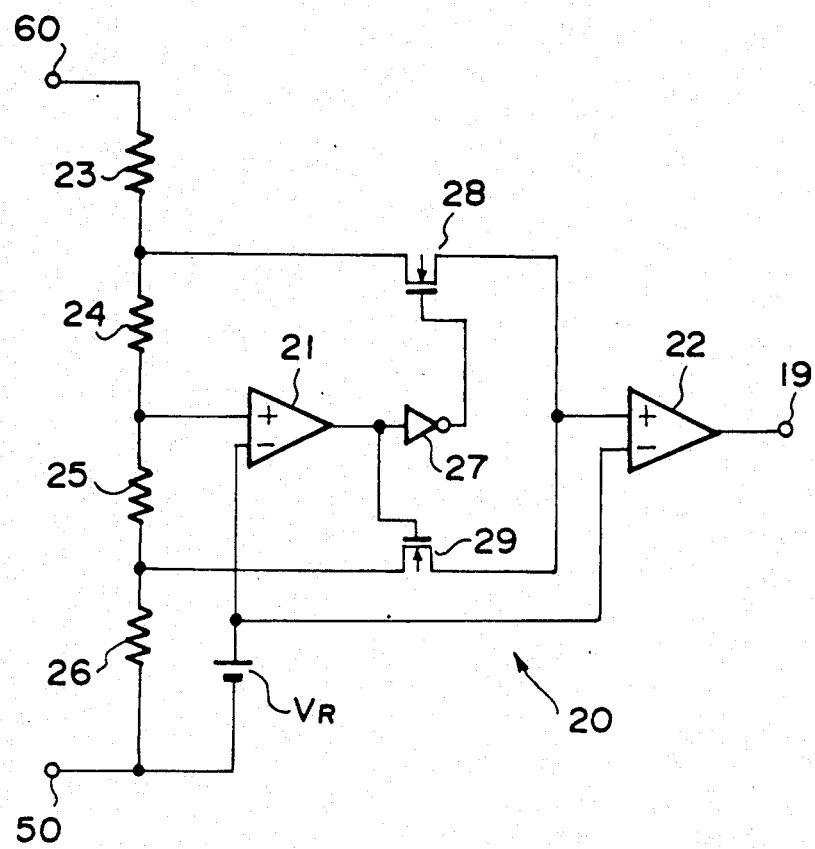
FIG. 4 shows a circuit diagram of a power supply voltage monitoring circuit of a second embodiment according to the present invention.

Next, FIG. 4 shows a voltage monitoring circuit 20 of the second embodiment according to the present invention.

In this second embodiment, four divider resistors 23 through 26 are connected in series between the high potential power supply line 60 and the low potential power supply line 50. The respective one ends of the divider resistors 24 and 25 are connected to a non-inversion input terminal of the comparator 21. The other end of the resistor 24 and one end of the resistor 23 are connected to the drain electrode of a MOS transistor switch 28. The other end of the resistor 24 and the one end of the resistor 23 are connected to the drain electrode of another MOS transistor switch 29. The output terminal of the comparator 21 is directly connected to the gate electrode of the MOS switch 29 and connected to the gate electrode of the MOS switch 28 through an invertor 27. The respective source electrodes of the MOS switches 28 and 29 are connected to a non-inversion input terminal of the comparator 22. To the respective inversion input terminals of the comparators 21 and 22, a high potential side of the reference voltage source $V_R$ is connected, while a low potential side thereof being connected to the low potential power supply line 50. An output of the comparator 22 is connected to the output terminal 19.

The resistance ratio of the divider resistors 23 through 26 is so preset that the comparator 21 changes its output level at the power supply voltage corresponding to $V_2$ in FIG. 2. The output of the comparator 21 and its inversion output inverted by the invertor 27 render the MOS transistor switches 28 and 29 selectively conductive at the power supply voltage $V_2$ as a boundary voltage, so that the voltages divided into those corresponding to $V_1$, $V_3$ in FIG. 2 are provided to the non-inversion input terminal of the comparator 22. Thus, as is the case shown in FIG. 2, the appropriate supply voltage monitoring operations can be effected by this embodiment for the respective two power supply systems.

Figure 5:
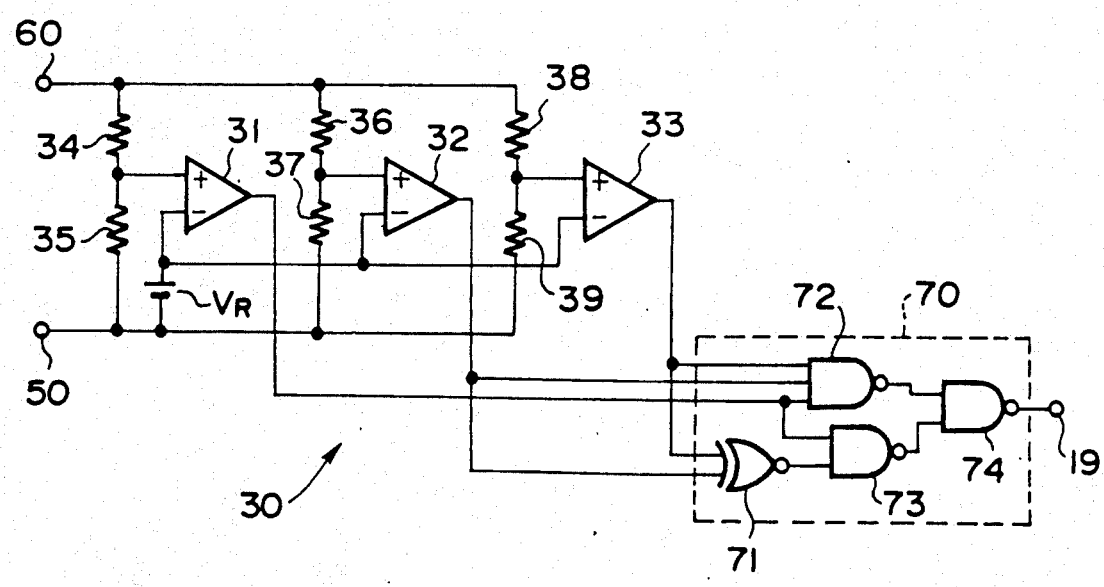
FIG. 5 shows a circuit diagram of a power supply voltage monitoring circuit of a third embodiment according to the present invention.

FIG. 5 shows a voltage monitoring circuit 30 of the third embodiment according to the present invention. This embodiment comprises a comparator 31, a comparator 32 and a comparator 33 and a logic circuit portion 70 which receives the outputs from all these comparators and determines as to the normality or abnormality of the power supply voltage. To be more specific, between the high potential power supply line 60 and the low potential power supply line 50, there are connected a combination of divider resistors 34 and 35, a combination of divider resistors 36 and 37, and a combination of divider resistors 38 and 39. An intermediate point between the resistors 34 and 35 is connected to a non-inversion input terminal of the comparator 31, the same between the resistors 36 and 37 to a non-inversion input terminal of the comparator 32 and, the same between the resistors 38 and 39 to a non-inversion input terminal of the comparator 33. The reference voltage source $V_R$ is connected at its high potential side commonly to the respective inversion input terminals of the above three comparators 31, 32 and 33, and at its low potential side to the low potential power supply line 50. The respective output terminals of the comparators 31, 32 and 33 are connected to the logic circuit portion 70. The logic circuit portion 70 is composed of a two-input Exclusive NOR gate 71, a three-input NAND gate 72 and two-input NAND gates 73 and 74. The Exclusive NOR gate 71 receives at its input terminals outputs from the comparator 32 and comparator 33. The NAND gate 72 receives at its input terminals outputs from the respective comparators 31, 32 and 33. The NAND gate 72 receives at its input terminals an output from the comparator 31 and an output from the Exclusive NOR gate 71. The NAND gate 74 receives respective outputs from the NAND gates 72 and 73 and its output is connected to the output terminal 19.

The resistance ratio between the divider resistors 34 and 35 is so established that, when the supply voltage becomes $V_1$, the voltage divided by the resistors 34 and 35 and applied to the non-inversion input terminal of the comparator 31 is the same voltage as that of the reference voltage source $V_R$. In the same manner, the resistance ratio between the divider resistors 36 and 37 is so preset that, when the supply voltage becomes $V_2$, the voltage divided by the resistors 36 and 37 and applied to the comparator 32 is the same voltage as that of the reference voltage source $V_R$. Further, the resistance ratio between the divider resistors 38 and 39 is so preset that, when the supply voltage becomes $V_3$, the voltage divided by the resistors 38 and 39 and applied to the comparator 33 is the same voltage as that of the reference voltage source $V_R$. The outputs of the respective comparators 31, 32 and 33 are shown in the following table.

| SUPPLY VOLTAGE | COMPARATOR 31 | COMPARATOR 32 | COMPARATOR 33 |
| --- | --- | --- | --- |
| $V_1 >$ | L | L | L |
| $V_1 << V_2$ | H | L | L |
| $V_2 << V_3$ | H | H | L |
| $V_3 >$ | H | H | H |

(L: Low Level, H: High level)

When the outputs of the comparators are inputted respectively to the logic circuit portion 70 which is composed of the Exclusive NOR gate 71 and the NAND gates 72, 73 and 74, the outputs are obtained from the output terminal 19 as follows:

| SUPPLY VOLTAGE | OUTPUT TERMINAL 19 |
|---|---|
| $V_1 >$ | L |
| $V_1 << V_2$ | H |
| $V_2 << V_3$ | H |
| $V_3 >$ | H |

Thus, the output characteristics obtained here are fully the same as those in FIG. 2.

Figure 6:
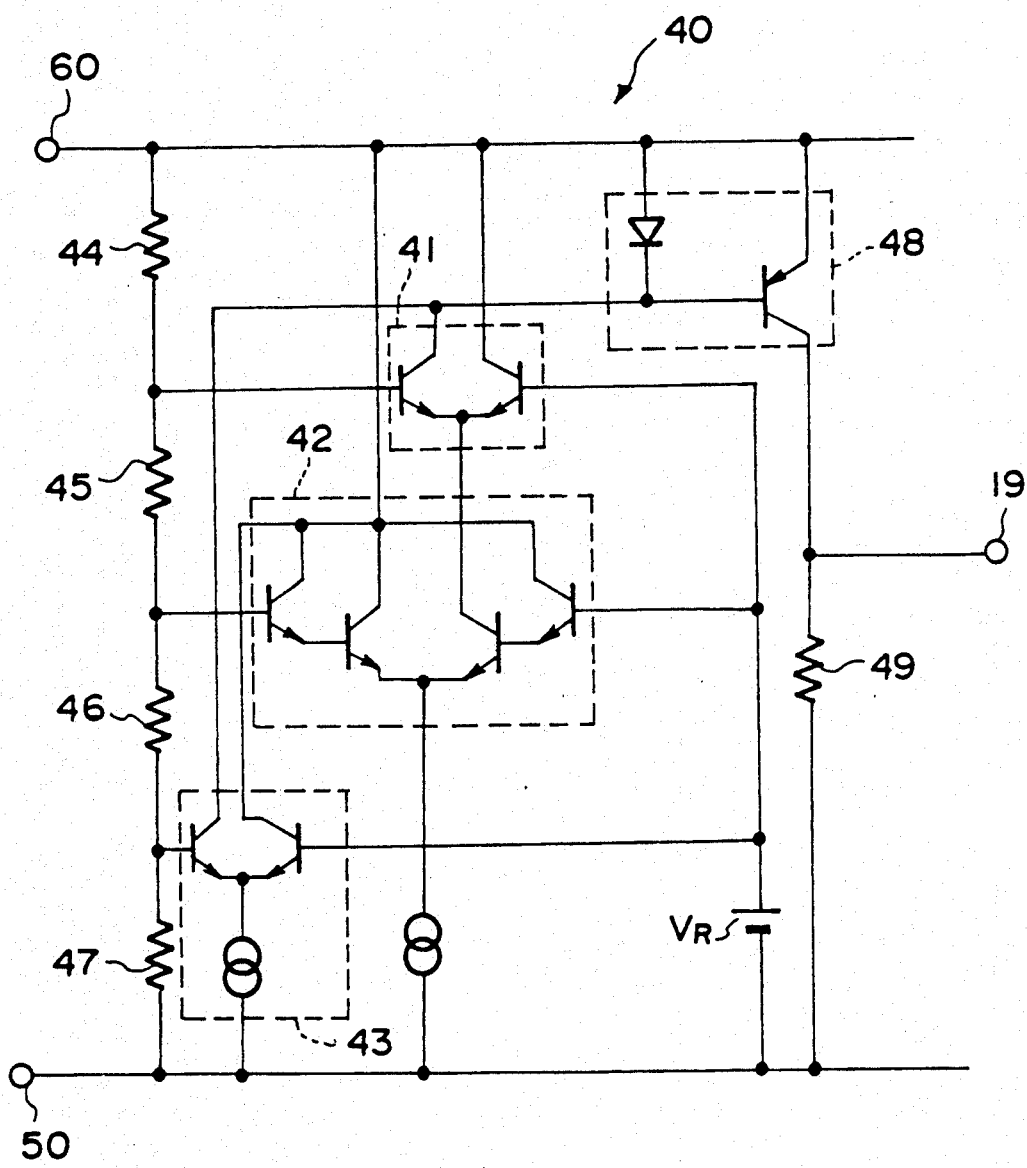
FIG. 6 shows a circuit diagram of a power supply voltage monitoring circuit of a fourth embodiment according to the present invention.

FIG. 6 shows a circuit diagram of a voltage monitoring circuit 40 of the fourth embodiment according to the present invention.

First, the resistance ratio of the divider resistors 44 through 47 is so preset that, when the supply voltage is $V_3$, the voltage across the divider resistor 47 becomes the same as that of the reference voltage source $V_R$. As a consequence, when the supply voltage is higher than $V_3$, an invertor 48 becomes conductive due to the output current from the comparator 43, thereby rendering the output terminal 19 to become high level. On the other hand, when the supply voltage is lower than $V_3$, the comparator 43 gives no influence on the output of the output terminal 19.

When the resistance ratio of the divider resistors 44 through 47 is so preset that, upon the supply voltage becoming $V_2$, the voltage across the serially connected divider resistors 46 and 47 becomes the same as that of the reference voltage source $V_R$ and also that, upon the supply voltage becoming $V_1$, the voltage across the serially connected divider resistors 45, 46 and 47 becomes the same as that of the reference voltage source $V_R$, the output current of the comparator 42 flows through the comparator 43 only during the period in which the supply voltage is in the range between $V_1$ and $V_2$, thereby driving the invertor 48 and rendering the level of the output terminal 19 to be a high level. Thus, the result as shown by graph in FIG. 2 is obtained.

An advantage obtained in this fourth embodiment is that, since the necessary logical operations are conducted by means of a wired logic, it has been made possible to eliminate otherwise necessary gate elements.

It is needless to say that the power supply voltage monitoring circuit 10 of the first embodiment which is incorporated in the semiconductor integrated circuit device as shown in FIG. 3 can be replaced by the respective monitoring circuits 20, 30, 40 of the second to fourth embodiments.

As explained above, the circuit according to the present invention is advantageous in that, without increasing the number of terminals, the circuit is capable of being employed in either of two power supply systems and of effecting an appropriate voltage monitoring operation in such power supply systems.

Heretofore, the explanation has been directed to a supply voltage monitoring circuit which is one intended to give an alarm upon the drop of the voltage but it is to be noted that the values of $V_1$, $V_2$, $V_3$ may be conversely set so as to detect an abnormal or extraordinary rise of the supply voltage, hence to protect against a high voltage.

While the invention has been described in its preferred embodiments, it is to be understood that the words which have been used are words of description rather than limitation and that changes within the purview of the appended claims may be made without departing from the true scope and spirit of the invention its broader aspects.

What is claimed is:

1. A power supply voltage monitoring circuit for use in a semiconductor circuit used with at least two power supply systems having different supply voltages and which is operable by switching high and low power supply voltages, said monitoring circuit comprising:
    a first power supply line to which a supply voltage to be monitored is supplied;
    a second power supply line;
    a reference voltage source connected at one side thereof to said second power supply line;
    a first comparing means connected to another side of said reference voltage source and receiving a supply voltage from said first power supply line, said first comparing means having a threshold value at a supply voltage being an intermediate voltage between said high and low power supply voltages and comparing a supply voltage received from said first power supply line with a reference voltage;
    a second comparing means connected to said another side of said reference voltage source and to said first power supply line, respectively, and comparing a voltage received therein with the reference voltage supplied thereto from said reference voltage source; and
    a switching means disposed between said first comparing means and said second comparing means and changing in response to an output from said first comparing means the voltage compared by said second comparing means,
    whereby an alarm signal indicating as to whether the supply voltage is normal or abnormal is obtained at an output of said second comparing means.

2. A power supply voltage monitoring circuit according to claim 1, in which said first comparing means includes a comparator and divider resistors connected in series between said first power supply line and said second power supply line, said comparator receiving at a non-inversion input terminal thereof a voltage divided by said divider resistors and at an inversion input terminal thereof said reference voltage.

3. A power supply voltage monitoring circuit according to claim 1, in which said second comparing means includes a comparator and three divider resistors connected in series between said first power supply line and said second supply line, said comparator receiving at a non-inversion input terminal thereof a voltage divided by said divider resistors and at an inversion input terminal thereof said reference voltage, and said switching means being connected across one of said divider resistors.

4. A power supply voltage monitoring circuit according to claim 3, in which said switching means is composed of an N-channel MOS transistor having a gate electrode connected to an output of said first comparing means, a drain electrode and a source electrode connected across the divider resistor one end of which is connected to the second power supply line.

5. A power supply voltage monitoring circuit according to claim 1, in which said first comparing means includes a comparator and first to fourth divider resistors connected in series between said first power supply line and said second power supply line, said comparator of said first comparing means receiving at a non-inversion input terminal thereof and from a connection point between a second and a third divider resistors a voltage divided by said divider resistors and an inversion input terminal thereof said reference voltage.

6. A power supply voltage monitoring circuit according to claim 1, comprising a pair of said switching means, said second comparing means including a comparator which receives at a non-inversion input terminal thereof the voltage to be compared through said pair of said switching means and at an inversion input terminal thereof said reference voltage.

7. A power supply voltage monitoring circuit according to claim 6, in which said switching means includes an invertor and a pair of MOS transistors each of which is conductive in response to an output from said first comparing means, one of said MOS transistors receiving at a gate electrode thereof an output from said first comparing means, said output being inverted by said invertor, while another MOS transistor receives at a gate electrode thereof an output directly from said first comparing means.

8. A power supply voltage monitoring circuit according to claim 1, which is incorporated in a semiconductor integrated circuit device and which operates to stop the operation of any related circuits in said semiconductor integrated circuit device when the supply voltage is detected by said monitoring circuit as abnormal.

* * * * *